US006799020B1

United States Patent
Heidmann et al.

(10) Patent No.: US 6,799,020 B1
(45) Date of Patent: Sep. 28, 2004

(54) PARALLEL AMPLIFIER ARCHITECTURE USING DIGITAL PHASE CONTROL TECHNIQUES

(75) Inventors: Peter D. Heidmann, Carlsbad, CA (US); Joseph P. Burke, Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/357,695

(22) Filed: Jul. 20, 1999

(51) Int. Cl.[7] ............................................... H04B 1/04
(52) U.S. Cl. ................... 455/103; 455/115.1; 330/107; 330/124 R; 330/295; 375/295
(58) Field of Search ............................... 455/103, 104, 455/105, 115, 126, 91, 313; 330/107, 124 R, 295; 375/295, 297; 331/1 A; 342/372

(56) References Cited

U.S. PATENT DOCUMENTS

| 5,184,093 | A | | 2/1993 | Itoh et al. ....................... 331/25 |
| 5,222,246 | A | | 6/1993 | Wolkstein ................... 455/13.4 |
| 5,256,987 | A | * | 10/1993 | Kibayashi et al. ........... 330/295 |
| 5,381,116 | A | * | 1/1995 | Nuckolls et al. ............. 331/1 A |
| 5,708,681 | A | | 1/1998 | Malkemes et al. |
| 5,754,597 | A | * | 5/1998 | Lurey et al. ................. 375/295 |
| 5,867,060 | A | | 2/1999 | Burkett, Jr. et al. |
| 5,872,481 | A | | 2/1999 | Sevic et al. |
| 5,884,143 | A | * | 3/1999 | Wolkstein et al. ....... 455/126 X |
| 6,046,649 | A | * | 4/2000 | Lange ..................... 375/297 X |
| 6,054,948 | A | * | 4/2000 | Dean .......................... 342/372 |
| 6,321,075 | B1 | * | 11/2001 | Butterfield .................. 455/313 |

FOREIGN PATENT DOCUMENTS

EP 0473299 3/1992

OTHER PUBLICATIONS

R. Kohl, et al., "Pamela—Linearized Solid State Power Amplifier at Ku–Band Frequency," Proceedings of the European Microwave Conference, GB, Tunbridge Wells, Reed Exhibition Company, Sep. 6, 1993, pp. 443–445.

R. Kohl, et al., "Pamela—A new Method for Linear and Efficient Power Amplification" Proceedings of the European Microwave Conference, GB, Tunbridge Wells, MEP, vol. Conf. 20, Sep. 10, 1990, pp. 310–315.

* cited by examiner

Primary Examiner—Nay Maung
Assistant Examiner—Philip J. Sobutka
(74) Attorney, Agent, or Firm—Russell B. Miller; Christopher Edwards

(57) ABSTRACT

An improved method and apparatus for using parallel amplifiers to efficiently amplify an information signal are disclosed. The improved apparatus utilizes digital signal manipulation techniques in optimizing the phase of the upconverted input signals provided to each of the parallel amplifiers. The phase and amplitude of the input signals are adjusted such that the power measured at the output of a combiner is maximized as compared to the sum of the power of combiner input signals.

56 Claims, 5 Drawing Sheets

PARALLEL AMPLIFIER ARCHITECTURE USING DIGITAL PHASE CONTROL TECHNIQUES

BACKGROUND OF THE INVENTION

I. Field of the Invention

The present invention relates to the amplification of high frequency wireless signals. More particularly, the present invention relates to a method of controlling signal phase and amplitude so that the output of multiple amplifiers can be efficiently combined.

II. Description of the Related Art

In the field of wireless transmitters, multiple amplifiers are often connected in parallel, and used to amplify a single signal. A transmitter which uses multiple amplifiers connected in parallel is called a parallel amplifier transmitter, and embodies a parallel amplifier architecture or design. The outputs of the parallel amplifiers in a transmitter are combined before transmission through one or more antennas.

The parallel amplifier architecture allows the use of smaller, less expensive amplifiers. Upon the failure of one of its multiple amplifiers, a parallel amplifier transmitter will not suffer a complete service outage, but will instead exhibit only a decrease in output power. In a single-amplifier design, the failure of a single amplifier will cause a service outage for the entire transmitter. For this reason, a single amplifier in a transmitter may be considered a single point of failure.

Unfortunately, efficient combining of the output of several parallel amplifiers is not trivial. Amplifiers vary in amplitude and phase characteristics such that the same signal fed into several amplifiers will generally result in a slightly different output signal from each amplifier. Unless the output signals of parallel amplifiers are nearly in-phase, they cannot be efficiently combined into the strongest combined output signal. In the worst case, amplifier outputs which are 180 degrees out of phase will destructively interfere with each other, resulting in minimal combined output power.

Several devices for combining multiple amplified signals are known in the art, and include in-phase combiners such as Wilkinson combiners, and quadrature phase combiners, such as Lange couplers. A Wilkinson combiner has two inputs and a single output, with the output generally representing the sum of the input signals. A Lange coupler also has two inputs, one of which is rotated 90 degrees prior to combining. In addition, a Lange coupler outputs a phase difference signal which may be used to determine the phase difference between the two input signals.

In a transmitter that uses multiple parallel amplifiers, each amplifier must typically be tuned at the factory to insure that the phase characteristics of the amplifiers are within some nominal range of each other. To enable such factory tuning, amplifiers are designed with phase trimming circuits such as potentiometers and varactors, both known in the art. Such factory tuning steps must be performed by qualified factory technicians, and are time consuming and costly. It would therefore be desirable to be able to eliminate such factory tuning steps.

Even after tuning amplifiers in the factory, additional measures are required to allow combining of signals from parallel amplifiers. Phase characteristics vary over temperature for each individual amplifier, as well as over time as each amplifier ages. In order to mitigate such amplifier phase variations, methods have been developed to perform real-time phase tuning of parallel amplifiers.

In order to enable real-time phase tuning of parallel amplifiers, some subset of the amplifiers must be equipped with the means to alter the phase of the output. This is typically done by inserting a voltage-controlled phase shifter between the signal source and the amplifier input. The analog control voltage used to control the phase shifter is derived by measuring the signals being provided to a combiner. In a design utilizing a Lange coupler, the Lange coupler's phase difference signal may be used in a control loop to adjust the control voltage of the phase shifter.

Problems remain with this method of aligning parallel amplifiers. Phase shifters, such as the types using varactors, have non-linear responses which introduce signal distortion into the phase-shifted output. Such distortion may be unacceptable in transmitting a high frequency signal. If the transmit signal is high frequency, then very fine adjustments in phase are necessary to prevent destructive interference. The resolution of a phase shifter may not be fine enough for use in high frequency parallel amplifiers. In addition, the circuits used to produce control voltages for the phase shifter will be subject to variation over time and temperature. Accounting for time and temperature variation further complicates the design of the control loop circuit which provides the phase shifter control voltage.

In addition, there is still a need to perform tuning of amplifiers in the factory, even if only to get the phase output close enough to allow proper functioning of the phase shifter control loop. It might be possible to eliminate the need for factory tuning by using precision components in the construction of the amplifier, but the use of such components would add to the material cost to the amplifier.

In existing designs using in-phase combiners, phase detector circuits are added to measure the phase difference between the inputs to the combiner. The phase detector circuits produce phase difference signal voltages that are provided to control loop circuits which provide analog control voltages to voltage-controlled phase shifters. Any lack of calibration in the phase detector circuits or phase distortion which occurs beyond the phase detector detracts from the combined output of the parallel amplifiers. Because the phase detectors, phase shifters, and control loop circuits are analog, they are subject to changes in characteristics over temperature and age.

In a parallel amplifier architecture which utilizes more than two amplifiers, multiple combiners may be cascaded to form the final combined output signal. At each layer of such a combiner cascade, however, additional phase variation may be introduced which detracts from the effectiveness of phase measurements at the individual amplifier outputs.

A parallel amplifier architecture is desired which efficiently combines the output of multiple parallel amplifiers. In addition, it is desirable that such a design not require expensive, high-precision components and not necessitate factory tuning. Furthermore, it is desirable that such a design be immune to changes in circuit behavior over temperature and over time.

SUMMARY OF THE INVENTION

The present invention solves the problems described above by using digital techniques to adjust the phase of source signals as they are generated. In an exemplary embodiment, direct digital synthesizers are used to produce phase-controlled upconverter mixing signals with very fine phase resolution. In another embodiment, digital signal processing techniques are used to perform linear filtering of signals in the digital domain, carefully controlling group delay to produce accurate phase shifting of amplifier input signals. The phase of the input signal provided to each amplifier is adjusted in real-time by a control module, which adjusts amplifier input signals to maximize the power measured at the output of the combiner or combiner network.

Because power measurements are used to optimize the input signal phase of each amplifier, the present invention may utilize either in-phase combiners such as Wilkinson combiners, quadrature phase combiners such as Lange couplers, or other types of signal combiners as appropriate.

Additionally, the output amplitudes of each of the parallel amplifiers are measured and balanced in real time. In addition to prolonging average MTBF of the amplifiers, balancing the outputs of parallel amplifiers having similar performance specifications reduces the chances of overdriving any one of them.

The present invention may be used in any system which allows digital manipulation of the transmit signals used as input to parallel amplifiers.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF PREFERRED EMBODIMENTS

Figure 1A:
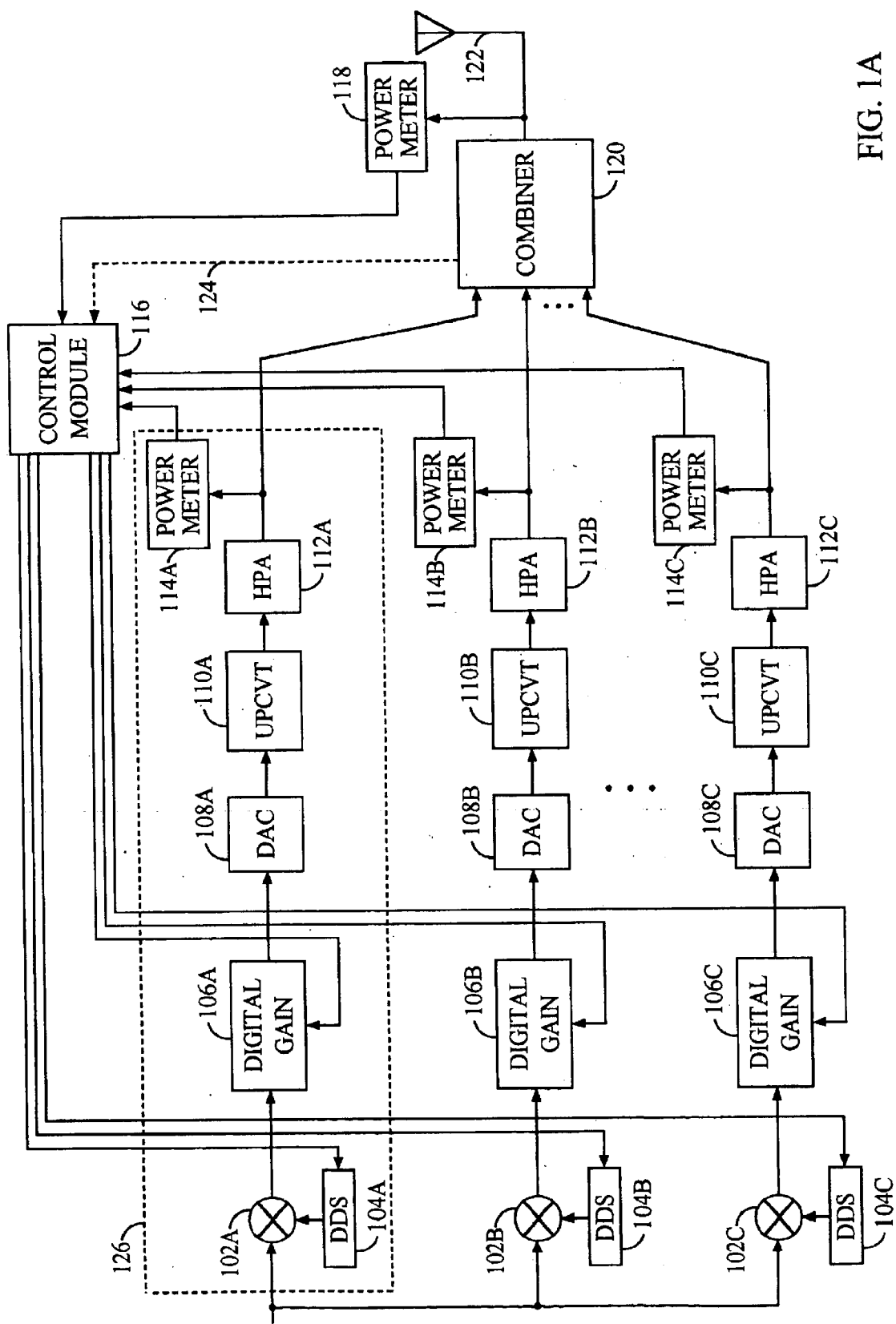
FIG. 1a is a block diagram of a parallel amplifier architecture applying phase control prior to digital-to-analog conversion of the signal in accordance with an embodiment of the invention.
Figure 1B:
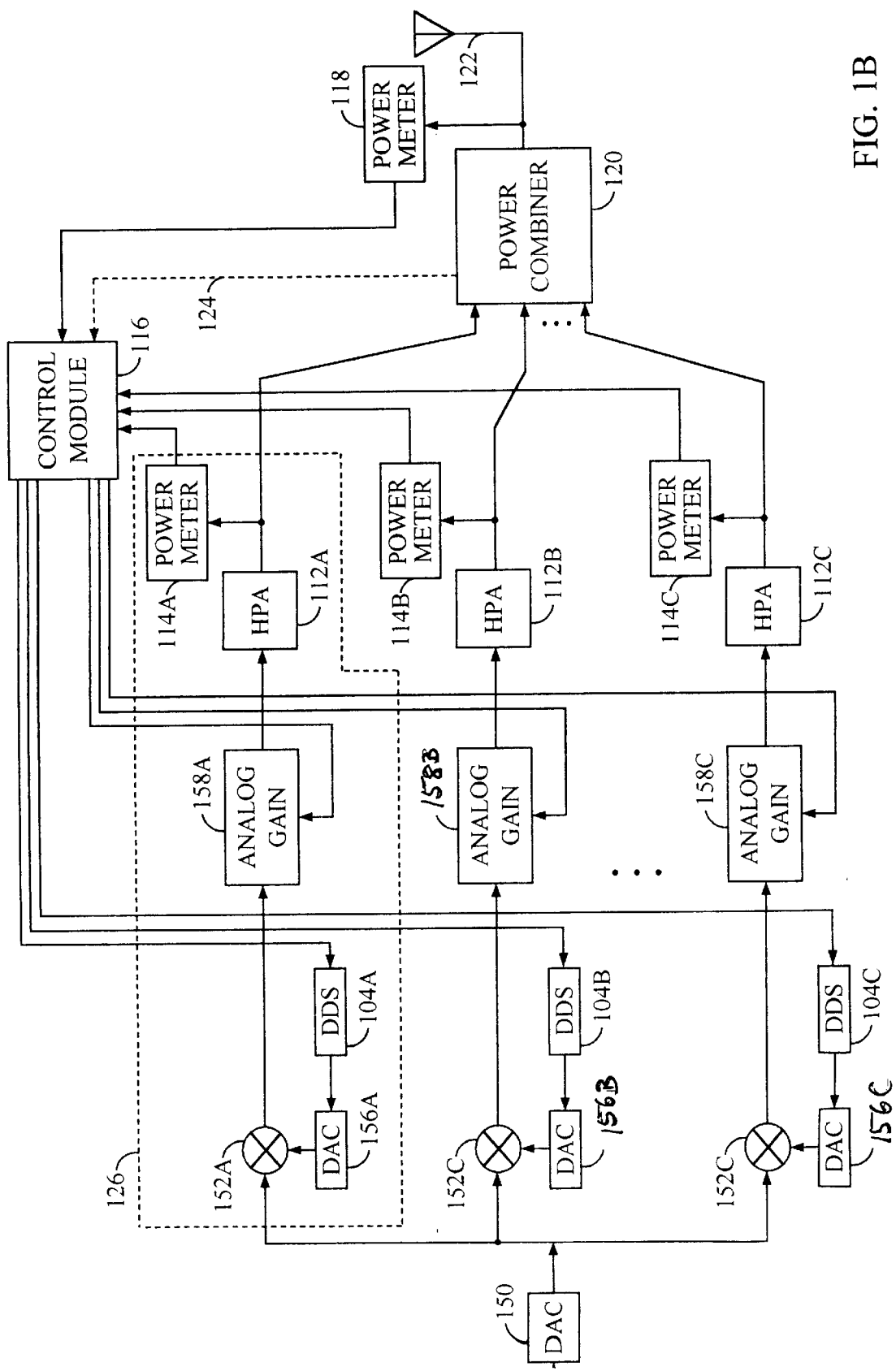
FIG. 1b is a block diagram of a parallel amplifier architecture applying phase control after digital-to-analog conversion of the signal in accordance with an embodiment of the invention.

FIG. 1a and FIG. 1b show parallel transmitter architectures configured accordance with separate embodiments of the present invention. The difference between the two architectures is whether phase control is performed on a digital or analog signal (before or after digital-to-analog conversion). The transmitter architectures are shown with multiple parallel high power amplifiers (HPA's) 112. Though shown with three parallel HPA signal paths, the architectures are equally useful in a transmitter having any number of parallel amplifiers greater than one.

In the embodiment shown in FIG. 1a, each signal is upconverted to an intermediate frequency (IF) in digital mixer 102, using a mixing signal generated by phase-controlled digital oscillators 104, shown implemented as direct digital synthesizers (DDS's). The resultant IF signal is then sent into digital gain block 106, which controls the gain of the IF signal provided to a digital to analog converter (DAC) 108. DAC 108 outputs an analog signal which is then provided to analog upconverter 110. Analog upconverter 110 upconverts the analog IF signal, producing a radio frequency (RF) signal which is provided to high power amplifier (HPA) 112.

The output of HPA 112 is provided to combiner module 120, where all amplified signals are combined to form the final signal provided to antenna 122. One skilled in the art will appreciate that combiner module 120 could utilize in-phase combiners such as Wilkinson combiners, quadrature phase combiners such as Lange couplers, or other signal combining techniques without departing from the present invention. In addition, further processing modules may be added between combiner module 120 and antenna 122 without departing from the present invention.

Control module 116 receives signal power measurement information from power meters 114 connected to the output of each high power amplifier (HPA) 112, and from a power meter 118 connected to the output of combiner module 120. Control module 116 uses the power measurement information from the combination of power meters to generate digital phase control signals for DDS's 104 and digital gain control signals for digital gain blocks 106. Control module 116 varies the control signals sent to DDS's 104 to maximize the ratio of power measured at the power meter 118 over the sum of power values measured at power meters 114. In addition, control module 116 varies the control signals sent to digital gain blocks 106 so that the power values measured at power meters 114 are approximately equal to each other. In an embodiment using Lange couplers, the phase difference outputs of the Lange couplers are provided to control module 116 for use in generating phase control signals.

In the embodiment shown in FIG. 1a, the set of components including digital mixer 102a, digital oscillator 104a, digital gain block 106a, DAC 108a, analog upconverter 110a, HPA 112a and power meter 114a form signal transmission subsystem 126. Any number of signal transmission subsystems can be used in a parallel amplifier transmitter without departing from the present invention.

In an alternative embodiment, digital gain blocks 106 utilize digital signal processing to perform spectrum shaping, equalization, or pre-emphasis of the signal to compensate for known irregularities in the frequency characteristics of each HPA 112. By applying different amounts of gain to the various frequency components of their input signals, this processing results in more efficient power spectral density at the output of each HPA 112.

In another embodiment, digital gain blocks 106 include linear digital filters which vary the linear slope of the frequency-to-phase response to create uniform group delay or phase shift. By using such digital signal processing techniques, digital gain block 106 may perform both the phase control and the gain control of the HPA 112 input signal, obviating the phase control at DDS 104.

Digital gain blocks 106 may be implemented using field-programmable gate arrays (FPGA), programmable logic devices (PLD), digital signal processors (DSP), application specific integrated circuit (ASIC) or other device capable of performing the required digital processing in response to signals from a controller such as control module 116. One skilled in the art will appreciate that this does not preclude implementing control module 116 inside one of the digital gain blocks 106. One skilled in the art will also appreciate that digital gain block 106 could also be placed before mixer 102, between phase-controlled oscillator 104 and mixer 102, or even built into phase-controlled oscillator 104 without departing from the present invention.

FIG. 1b shows a transmitter architecture configured in accordance with an alternative embodiment of the invention. In this alternative embodiment, the input signal to the parallel amplifier is converted from digital to analog by digital-to-analog converter 150 prior to upconversion in analog mixers 152. The mixing signals for analog mixers 152 are produced by phase-controlled digital oscillators 104, shown implemented as direct digital synthesizers (DDS's), and are converted to analog signals by digital-to-analog converters (DAC) 156 before mixing. The combination of a DDS connected to a DAC may also be called an "analog DDS." The output of each analog mixer 152 is provided to an optional analog gain block 158, which varies the gain of the upconverted signal before the signal is amplified in HPA 112. Both the phase controlled digital oscillators 104 and the analog gain blocks 158 are connected to control module 116, and receive gain and phase control signals from the control module 116.

The degree of phase shift provided by each DDS 104 and the degree of gain change introduced at each analog gain block 158 is controlled by control module 116. In this embodiment, control module 116 varies digital phase control signals sent to DDS's 152 so as to maximize ratio of power measured at the power meter 118 over the sum of power values measured at power meters 114. In addition, control module 116 varies control signals sent to analog gain blocks 158 so that the power values measured at power meters 114 are approximately equal to each other. The control signals sent by control module 116 to analog gain blocks 158 may be either digital or analog as required by the analog gain block implementations, many of which are well known in the art.

In the alternative embodiment shown in FIG. 1b, the set of components including analog mixer 152a, digital oscillator 104a, DAC 156a, analog gain block 158a, HPA 112a and power meter 114a form signal transmission subsystem 126. As with the embodiment shown in FIG. 1a, any number of like signal transmission subsystems can be used in a parallel amplifier transmitter without departing from the present invention.

One skilled in the art will recognize that, in all described embodiments, power meters 114 and 118 could be any of a variety of known power measurement devices, including diode detectors and logarithmic amplifiers without departing from the present invention.

In an alternative embodiment of the invention, control module 116 has access to a memory device, such as dynamic, non-volatile, or battery-backed random access memory. In this embodiment, initial phase and gain values are stored in the memory device at the factory, and may be updated during operation in the field. These initial phase and gain values are configured and retrieved at appropriate times to speed up optimization. For example, upon power-up of a parallel amplifier transmitter, the phase-controlled oscillators and gain blocks are initialized to values retrieved the memory, and optimization proceeds from these initialization values. Upon subsequent stabilization of these parameters, the new values for the parameters may be updated in memory.

In another embodiment, amplifiers 112, and optionally combiner 120, are designed with built-in temperature measurement devices, such as thermistors thermocouples, or digital thermometers. In such an embodiment, a table of initialization parameters corresponding to specific temperature values of the amplifiers and combiner are stored in, and later retrieved from, the memory device. As the temperature of each amplifier 112 changes, these parameters are used to alter the spectrum shaping characteristics of each digital gain block 106. The table of phase and gain settings over temperature may be updated to the memory device to compensate for the changes in amplifier characteristics over time.

In an embodiment wherein combiner 120 includes quadrature phase combiners, such as Lange couplers, which provide phase difference output signals, those phase difference output signals may be provided through signal path 124 to control module 116 for use in optimizing the phase of the input signal of each amplifier 112. Where combiner 120 is a cascade of dual-input Lange couplers, the phase of signals from the parallel amplifiers 112 are adjusted such that each Lange coupler is provided with two input signals that are 90 degrees out of phase with each other.

Figure 2:
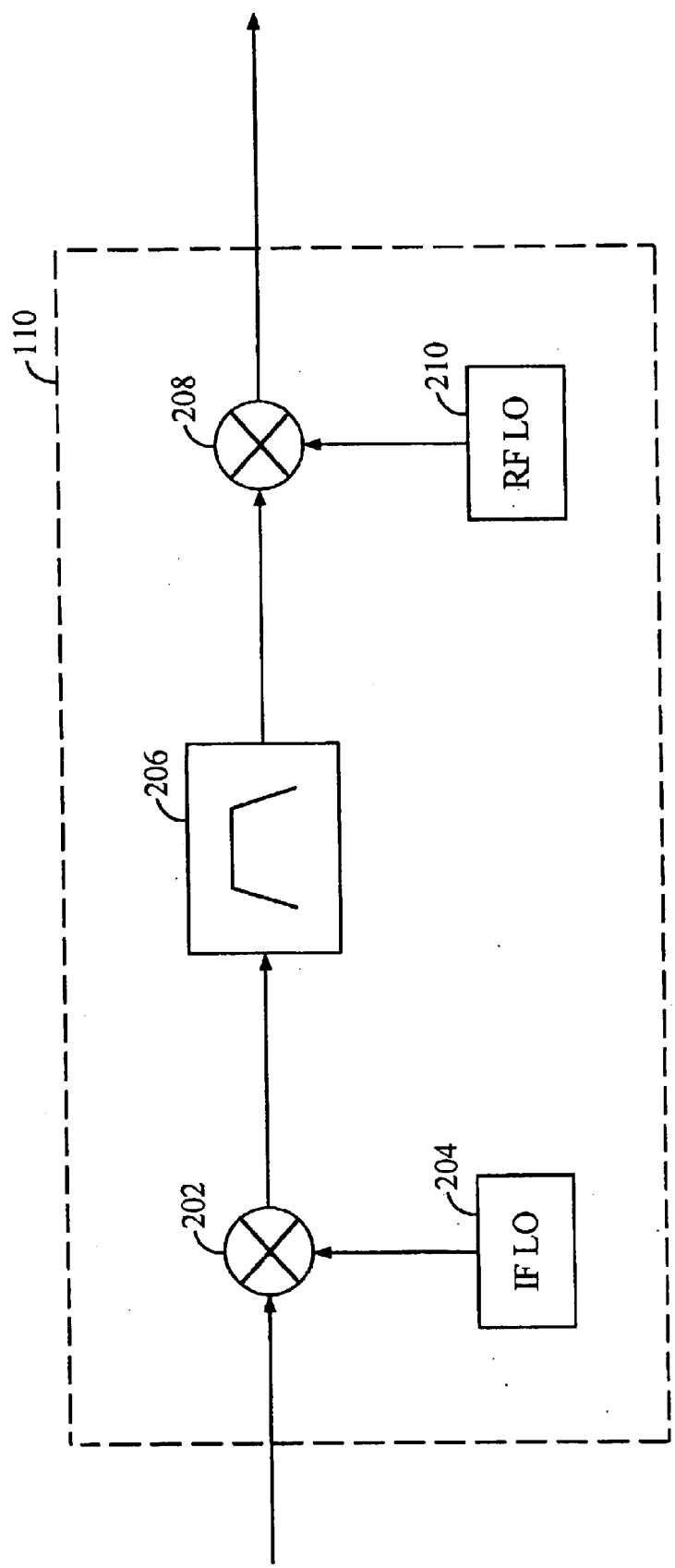
FIG. 2 is a block diagram of a two-stage upconverter in accordance with additional embodiments of the invention.

FIG. 2 shows an upconverter structure in accordance with an alternative embodiment of the invention. In designing the upconverter apparatus in a transmitter system, multiple stages of upconversion are often necessitated by the frequency plan for such a design.

In an embodiment using a DDS to produce phase-controlled mixing signals within upconverter 110, a phase control signal from control module 116 is sent to upconverter 110 instead of DDS 104. In another alternative embodiment, DDS 104 and mixer 102 are omitted entirely, and upconversion of the baseband signal is performed completely by upconverter 110.

In a parallel amplifier transmitter utilizing the multiple stage upconverter 110 shown in FIG. 2, an intermediate frequency (IF) mixing signal is provided to analog mixer 202 by local oscillator (LO) 204. A radio frequency (RF) mixing signal is provided to analog mixer 208 by local oscillator 210. Out-of-band frequency components are removed by bandpass filter 206, which has a center frequency equal to the frequency of local oscillator 204. Either or both local oscillators 204 and 208 may implemented as a phase-controlled analog DDS controlled by control module 116. Allowing phase control at upconverter 110 makes it unnecessary to control the phase of digital oscillators 104.

Depending upon the frequency plan and the phase resolution required by the system, tradeoffs between the frequency, phase variation resolution, and complexity of the DDS may be relevant considerations in the design of the transmitter. If phase control is implemented at intermediate frequency DDS 104, any phase adjustment introduced at mixer 102 will be magnified by upconverter 110. Thus, a phase-controlled DDS 104 would have to have very fine phase resolution, requiring DDS 104 to have a large amount of memory. Though less phase resolution would be required at a higher frequency, such as at RF local oscillator 208, a wider range of phase offsets is generally required to compensate for differences in the parallel amplifier signal paths.

Figure 3:
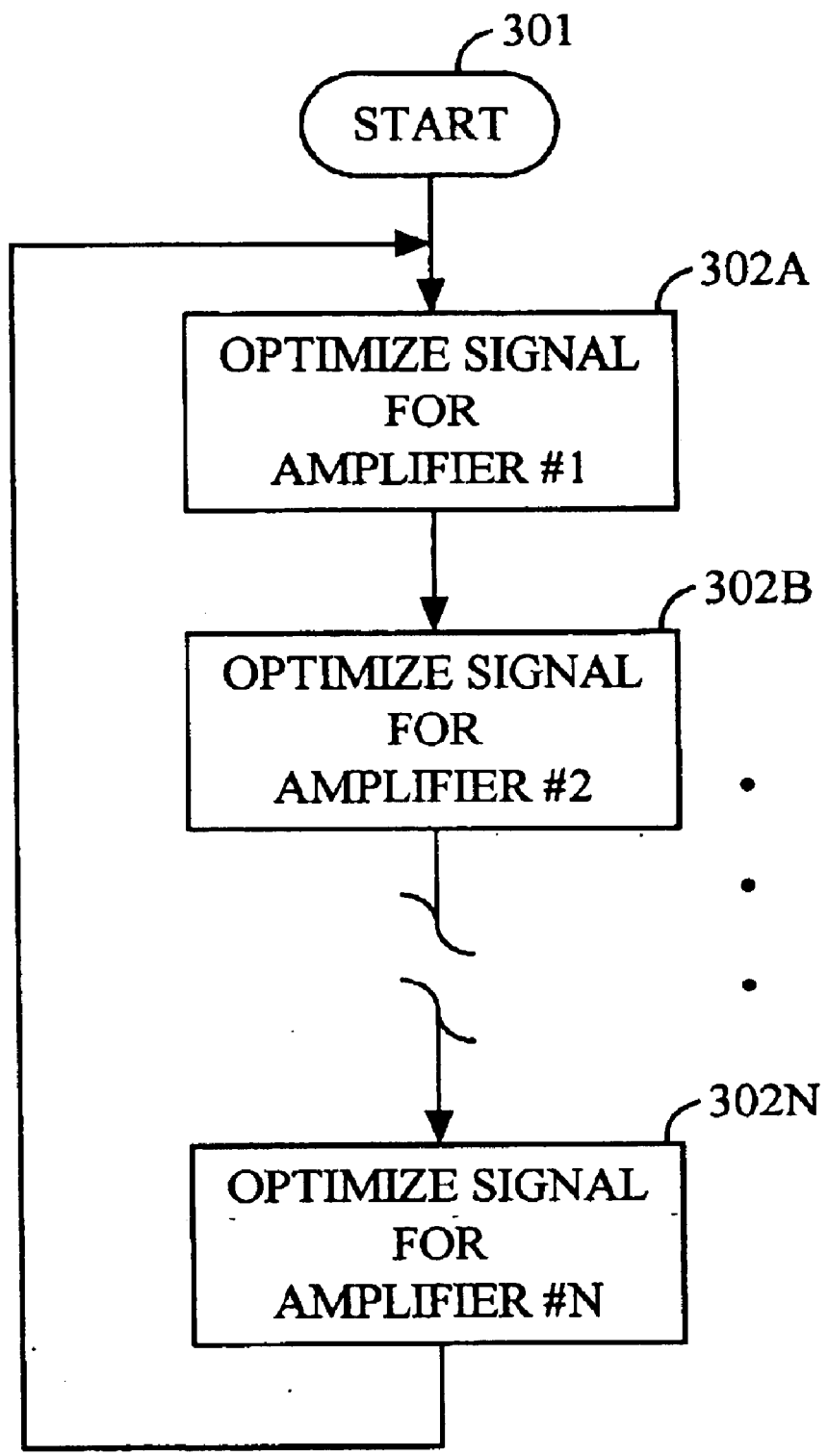
FIG. 3 is a high-level flow chart of a process of optimizing the inputs of all amplifiers in a parallel amplifier transmitter in accordance with an embodiment of the invention.

FIG. 3 is a high-level flowchart depicting a process for optimizing parallel amplifier inputs according to an embodiment of the invention. The start 301 of the process may occur upon power-up of the transmitter, or at any appropriate time thereafter. At step 302, the input signal phase, gain, or both are adjusted for amplifiers one through n in a parallel amplifier transmitter.

First, the input signal for amplifier #1 is adjusted in step 302a to maximize combining efficiency. Then, the input signal for amplifier #2 is adjusted 302b to maximize combining efficiency. The process continues through each of the n parallel amplifiers. After the input signal for the nth amplifier is optimized 302n, the process is repeated, as appropriate, starting again with optimization of the first amplifier 302a.

With the temporary selection of one amplifier whose input is to be adjusted, n−1 amplifiers will remain whose input phase and gain will be constant. The outputs of those (n−1) amplifiers, when combined, will form a sum signal which has a single amplitude and phase. The step of optimizing one amplifier aligns that one amplifier's phase with the phase of the sum signal of the other (n−1) amplifiers. Upon performing each pass in steps 302a–n through all n amplifiers, the alignment of the amplifier outputs in the combiner improves until limited by the resolution of the power meters being used. Steps 302a–n are continuously executed as necessary to compensate for transmitter variations over time and temperature.

One skilled in the art will appreciate that many variations of this process could be implemented without departing from the present invention. For example, the ordering of steps 302a–n could be adjusted based on randomization upon each pass through the loop, or could be based on the magnitude of adjustments made during the previous pass.

Figure 4:
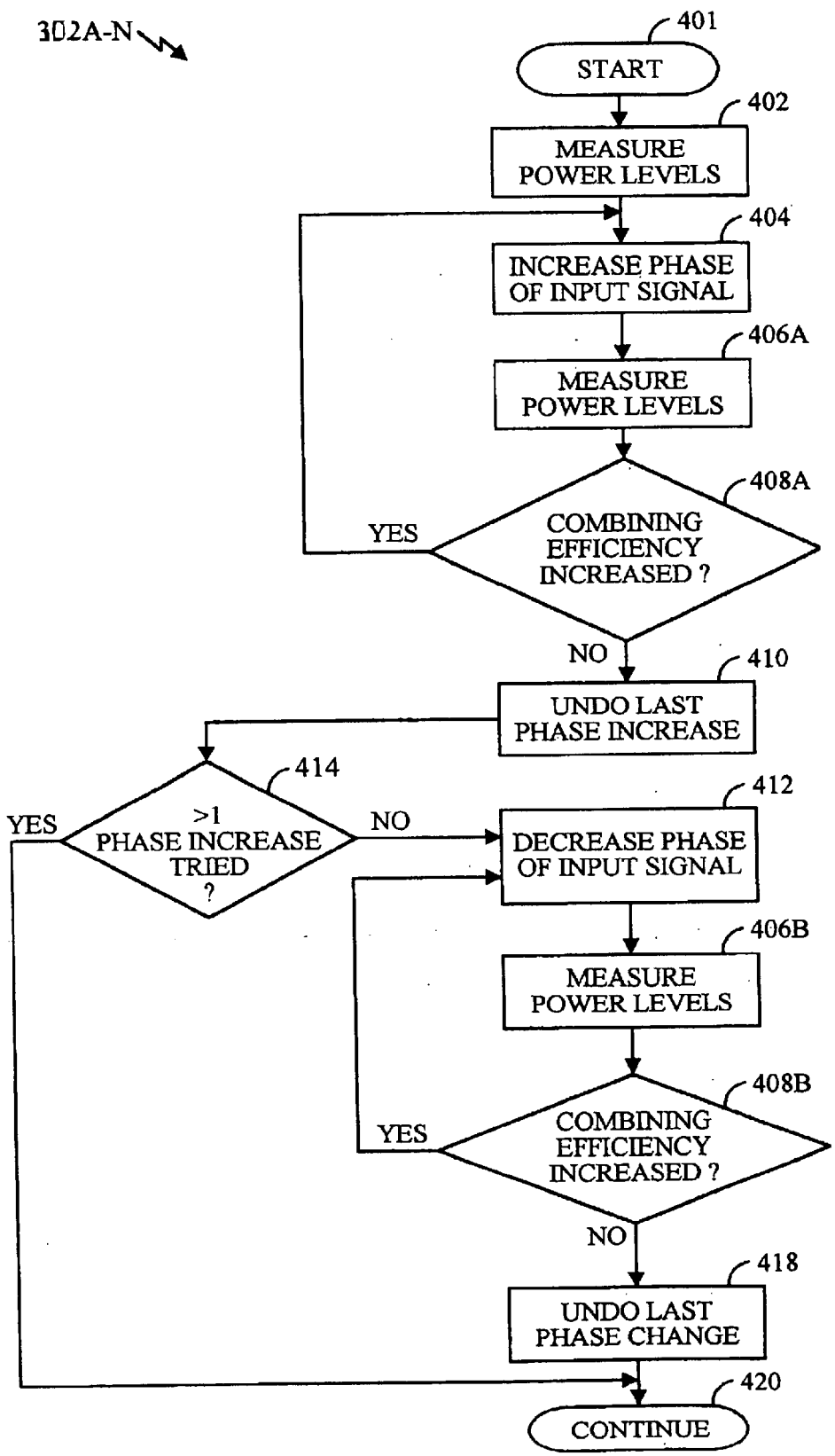
FIG. 4 is a flow chart detailing a process for optimizing the input of a single amplifier in accordance with an embodiment of the invention.

FIG. 4 is a flowchart depicting, in more detail, a process for optimizing the input of a single amplifier 302 according to an embodiment of the invention. The process of optimizing the input signal of a single amplifier starts 401 and continues on to the next amplifier 420 after the signal is aligned with the sum of all other amplifier signals.

The first step in optimizing the input signal for a single amplifier begins with measuring the power output by each of the parallel amplifiers, as well as the power output by combiner 402.

After recording these power levels as a baseline, the phase of the input signal to the selected amplifier is offset by a predetermined positive phase value 404.

Measurement step 406a may repeat all or a selected subset of the power measurements in step 402. In an alternate embodiment, where the previous power levels for individual amplifier outputs are presumed to be reasonably stable, the subset of power measurements conducted at step 406a consists of measuring the power output by the combiner. In another alternate embodiment, the subset consists of measuring the combiner power output and the output of the amplifier whose input is being adjusted.

After the phase adjustment 404 is complete, and the resultant power levels adjusted or measured, the combining efficiency is evaluated 408a. In the preferred embodiment of the invention, the combining efficiency is evaluated according to equation (1). Other equations may be used during evaluation of combining efficiency 408a without departing from the present invention. The power values measured at power meters 114 are added together to form an input power sum. The power measured at the output of combiner 120 by power meter 118 is then divided by this input power sum to yield the combining efficiency. Dividing output power by input power of the combiner makes combining efficiency measurement less susceptible to fluctuations in the signal waveform being amplified.

$$\text{Combining Efficiency} = \frac{P_{OUT}}{\sum_{i=1}^{n} P_i} \quad (1)$$

At decision step 408a, the change in combining efficiency resulting from the phase adjustment 404 is evaluated. If the combining efficiency increases, steps 404, 406a, and 408a are repeated, and are repeated until increasing the phase of the signal no longer results in a measurable increase in combining efficiency. When one of these phase adjustments 404 results in a decrease in combining efficiency, that most recent phase adjustment is undone (reversed) 410. Step 410 restores the input signal phase to its state prior to the most recent phase adjustment.

At step 414, the effects of increasing signal phase are evaluated to see if decreasing signal phase is necessary. If steps 404 through 410 resulted in a lasting phase increase, the steps of trying out a decrease in phase (steps 412 to 418) are skipped. In other words, if more than one phase increase has been made, or if steps 404, 406, and 408 resulted in a phase increase which is not undone by step 410, then it is not necessary to evaluate whether decreasing the phase of the input signal will improve combining efficiency. In this case, the present method proceeds from step 414 to step 420.

If, however, it is still questionable whether a phase decrease would improve combining efficiency, the phase of the input signal to the selected amplifier is offset by a predetermined negative phase value 404.

For the same reasons as with measurement step 406a, measurement step 406b may be a repeat of all or a selected subset of the power measurements in step 402. The power measurements yielded by the previous step 406a are used as a baseline in evaluating a change in combining efficiency 408b. In the preferred embodiment of the invention, the evaluation of combining efficiency in 408b is conducted according to equation (1). As with step 408a, other equations may be used during evaluation of combining efficiency 408b without departing from the present invention.

At decision step 408b, the change in combining efficiency resulting from phase adjustment 412 is evaluated. If the combining efficiency increases, steps 412, 406b, and 408b are repeated, and are repeated until increasing the phase of the signal no longer results in a measurable increase in combining efficiency. When one of these phase adjustments 412 decreases combining efficiency, the most recent phase adjustment is undone (reversed) 410. Step 410 restores the input signal phase to its state prior to the most recent phase adjustment.

After step 418, optimization of the selected amplifier's input signal 302 is concluded 420, and optimization typically moves on to input signal of the next amplifier.

Several variations of the described process are also anticipated by embodiments of the present invention. It is often desirable to maintain a constant output power level measured at the output of the combiner during amplifier input optimization. In a preferred embodiment of the invention, process 302 includes balancing the outputs of the amplifiers after each phase adjustment 404 or 412. Either the parallel amplifiers or their respective input signals are adjusted after each phase adjustment such that the power measured at the output of the combiner remains approximately the same throughout the phase adjustments of the amplifier input signal. The gains are also adjusted such that the power levels measured at each amplifier output are approximately equal to each other. Such an adjustment could be performed as part of power measurement step 406.

In another embodiment, the phase increments used in steps 404 and 412 are varied according to the degree of confidence in prior optimizations. For example, if the transmitter has recently been powered on, or the temperature of the parallel amplifiers has not stabilized, larger increments could be tried to quickly move the phase of the selected amplifier into a coarse range of the sum signal of the other amplifiers. If several such coarse adjustments have been used to reach step 410, processing could continue with step 404 using a smaller phase increment. Likewise, if several coarse adjustments have been immediately prior to reaching step 418, processing could continue with step 412 using a smaller phase increment.

In an alternate embodiment of the invention, control module 116 has access to memory containing initialization parameters. In this embodiment, start step 401 includes retrieval of initialization phase and gain parameters and using those values to configure the transmitter before measuring power levels 402. In a transmitter which further includes temperature sensors, and in which the initialization parameters are stored in a table according to temperature, the initialization values used in 401 are selected according to initial temperature measurements. The processing at continue step 420 include updating initialization parameters as appropriate.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. Parallel amplifier transmitter comprising:
   a) first signal transmission subsystem comprising a phase-controlled digital oscillator for generating a first phase-controlled digital mixing signal having a phase based on a first phase control signal, wherein the first signal transmission subsystem uses the first phase-controlled digital mixing signal to produce a first phase-controlled amplified signal having a first phase based on the first phase control signal;
   b) at least one additional signal transmission subsystem, each producing an additional phase-controlled amplified signal;
   c) combiner means for combining said phase-controlled amplified signals to produce a combined amplified signal;
   d) combiner power measurement means, operably connected to said combiner means, for measuring the power of said combined amplified signal and producing a combiner power measurement; and
   e) control module, operably connected to said combiner power measurement means and to each of said signal transmission subsystems, for receiving said combiner power measurement from said combiner power measurement means and for receiving a subsystem power measurement based on each of said phase-controlled amplified signals produced by each of said signal transmission subsystems, and for adjusting said first digital phase control signal based on the values of said combiner power measurement and said subsystem power measurements.

2. Apparatus for upconverting and amplifying a signal comprising:
   a) combiner means for combining a plurality of amplified signals to produce a combined amplified signal;
   b) combiner power measurement means, operably connected to said combiner means, for measuring the power of said combined amplified signal and producing a combiner power measurement; and
   c) at least two signal transmission subsystems, operably connected to said combiner means, each signal transmission subsystem further comprising:
      1) amplifier for amplifying a phase-controlled signal and producing one amplified signal of said plurality of amplified signals;
      2) subsystem power measurement means for measuring the power of said one amplified signal and producing a subsystem power measurement; and
      3) linear digital filter, operably connected to said amplifier, for subjecting a signal to a controlled group delay to produce said phase-controlled signal, wherein said controlled group delay is based on a digital phase control signal.

3. The apparatus of claim 2 wherein said combiner means comprises Wilkinson combiners.

4. The apparatus of claim 2 further comprising control module, operably connected to said combiner power measurement means, to each of said subsystem power measurement means and to each of said linear digital filters, for generating each of said digital phase control signals based on the values of said combiner power measurement and said subsystem power measurements measured in relation to adjustments of said digital phase control signal.

5. The apparatus of claim 4 wherein said combiner means comprises Lange couplers.

6. The apparatus of claim 5 wherein said Lange couplers are operably coupled to said control module and provide signal phase information to said control module, and wherein said digital phase control signals are based on said signal phase information.

7. A process for amplifying a signal comprising the steps of:
   a) combining at least two amplified signals to produce a combined amplified signal;
   b) measuring the power of said combined amplified signal and producing a combiner power measurement; and
   c) generating each of said at least two amplified signals, wherein said step of generating for each amplified signal further comprises:
      1) mixing a signal with a digitally phase-controlled mixing signal to produce an upconverted signal;
      2) amplifying said upconverted signal to produce one amplified signal of said plurality of amplified signals;
      3) measuring the power of said one amplified signal and producing a subsystem power measurement;
      4) generating said digitally phase-controlled mixing signal in accordance with a digital phase control signal;
      5) adjusting said digital phase control signal based on a combining efficiency measurement; and
      6) generating said combining efficiency measurement based on the subsystem power measurement generated from each of said at least two amplified signals and on said combiner power measurement.

8. The process of claim 7 wherein said step of generating said combining efficiency measurement comprises dividing said combiner power measurement by the sum of said subsystem power measurements.

9. The process of claim 7 wherein the mixing of step 1) is analog mixing, and wherein said step of generating said digitally phase-controlled mixing signal further comprises the steps of:
   4.1) utilizing a direct digital synthesizer to generate a digital mixing signal having a phase based on said digital phase control signal; and
   4.2) performing digital-to-analog conversion of said digital mixing signal to produce said phase-controlled mixing signal.

10. The process of claim 7 wherein the mixing of step 1) is digital mixing, and wherein said step of generating said digitally phase-controlled mixing signal comprises the step of utilizing a direct digital synthesizer to generate a digital mixing signal having a phase based on said digital phase control signal.

11. The process of claim 7 wherein said step of mixing a signal with a digitally phase-controlled mixing signal further comprises the step of applying a gain to said signal based on the subsystem power measurements measured from each of said at least two amplified signals.

12. A process for amplifying a signal comprising the steps of:
   a) combining at least two amplified signals to produce a combined amplified signal;
   b) measuring the power of said combined amplified signal and producing a combiner power measurement; and
   c) generating each of said at least two amplified signals, wherein said step of generating for each amplified signal further comprises:
      1) performing linear digital filtering of a signal to produce a group delay equivalent to a phase shift of said signal to produce a phase-controlled signal, wherein said filtering is adjusted such that the magnitude of said phase shift is based on a digital phase control signal;
      2) adjusting said digital phase control signal based on a combining efficiency measurement; and
      3) generating said combining efficiency measurement based on the subsystem power measurement generated from each of said at least two amplified signals and on said combiner power measurement.

13. A process for amplifying a signal comprising the steps of:
   a) generating a first digital phase control signal;
   b) using a first phase-controlled oscillator to generate a first phase-controlled mixing signal based on said first digital phase control signal;
   c) mixing said first phase-controlled mixing signal with a first input signal to produce a first upconverted signal;
   d) amplifying said first upconverted signal to produce a first amplified signal;
   e) measuring the power of said first amplified signal to produce a first power measurement signal;
   f) generating a second upconverted signal;
   g) amplifying said second upconverted signal to produce a second amplified signal;
   h) measuring the power of said second amplified signal to produce a second power measurement signal;
   i) combining said first amplified signal and said second amplified signal to produce a combined amplified signal;
   j) measuring the power of said combined amplified signal to produce a combined power measurement signal;
   k) generating a first power combining efficiency signal based on said first power measurement signal, said second power measurement signal, and said combined power measurement signal;
   l) adding an offset to said first digital phase control signal to cause modification of said first phase-controlled mixing signal;
   m) thereafter generating a second power combining efficiency signal; and
   n) where said second power combining efficiency signal is less than said first power combining efficiency signal, subtracting said offset from said first digital phase control signal.

14. The process of claim 13 wherein said first power combining efficiency signal is generated by dividing said combined power measurement signal by the sum of said first power measurement signal and said second power measurement signal.

15. The process of claim 13 wherein said step m) comprises the sub-steps of:
   m.1) generating a set of modified measurement signals; and
   m.2) generating said second power combining efficiency signal based on said set of modified measurement signals.

16. The process of claim 13 wherein said first input signal and said first phase-controlled mixing signal are analog signals, and wherein said step of mixing said first phase-controlled signal further is analog mixing.

17. The process of claim 13 wherein said sub-step of generating a second upconverted signal further comprises the sub-steps of:
   f.1) utilizing a direct digital synthesizer to generate a second analog mixing signal; and
   f.2) performing a second analog mixing by multiplying a second analog input signal with said second analog mixing signal to produce a second analog upconverted signal.

18. The process of claim 17 further comprising the step of applying a first analog gain to said first upconverted signal before said step of amplifying said first upconverted signal, and further comprising the step of applying a second analog gain to said second upconverted signal before said step of amplifying said second upconverted signal.

19. The process of claim 18 further comprising the step of adjusting said first analog gain such that said first power measurement signal is approximately equal to said second power measurement signal.

20. The process of claim 15 wherein said set of modified signals comprises a modified combined power measurement signal produced by measuring the power of said combined amplified signal.

21. The process of claim 20 wherein said second power combining efficiency signal is generated by dividing said modified combined power measurement signal by the sum of said first power measurement signal and said second power measurement signal.

22. The process of claim 20 wherein said set of modified signals further comprises a modified first power measurement signal produced by measuring the power of said first amplified signal.

23. The process of claim 22 wherein said set of modified signals further comprises a modified second power measurement signal produced by measuring the power of said second amplified signal.

24. The process of claim 23 wherein said second power combining efficiency signal is generated by dividing said modified combined power measurement signal by the sum of said modified first power measurement signal and said modified second power measurement signal.

25. The process of claim 13 wherein said first input signal and said first phase-controlled mixing signal are digital signals, and wherein said step of mixing said first phase-controlled signal further comprises the sub-steps of:
   c.1) performing a first digital mixing by multiplying said first input signal with said first phase-controlled mixing signal to produce a first digital upconverted signal; and
   c.2) performing first digital-to-analog conversion of said first digital upconverted signal to produce said first upconverted signal.

26. The process of claim 25 wherein said sub-step of generating a second upconverted signal further comprises the sub-steps of:
   f.1) utilizing a direct digital synthesizer to generate a second digital mixing signal;

f.2) performing a second digital mixing by multiplying a second digital input signal with said second digital mixing signal to produce a second digital upconverted signal; and f.3) performing second digital-to-analog conversion of said second digital upconverted signal to produce said second upconverted signal.

27. The process of claim 26 further comprising the step of applying a first digital gain to said first digital upconverted signal before performing said first digital-to-analog conversion, and further comprising the step of applying a second digital gain to said second digital upconverted signal before performing said second digital-to-analog conversion.

28. The process of claim 27 further comprising the step of generating said first digital gain and said second digital gain based on said first power measurement signal, said second power measurement signal, and said combined power measurement signal.

29. Apparatus for upconverting and amplifying a signal comprising:

combiner for combining a plurality of amplified signals to produce a combined amplified signal; and at least two signal transmission subsystems, wherein each signal transmission subsystem comprises:

phase-controlled digital oscillator for generating a phase-controlled digital mixing signal, wherein the phase of said phase-controlled digital mixing signal is based on a digital phase control signal;

digital mixer for mixing a digital signal with said phase-controlled digital mixing signal to produce an upconverted signal;

amplifier for amplifying said upconverted signal to produce one amplified signal of said plurality of amplified signals; and control module for generating each of said digital phase control signals based on a combiner power measurement measured at the output of said combiner.

30. The apparatus of claim 29 further comprising combiner power meter for measuring the power of said combined amplified signal and producing a combiner power measurement.

31. The apparatus of claim 29, wherein each of said signal transmission subsystems further comprises a subsystem power meter for measuring the power of said one amplified signal and producing a subsystem power measurement.

32. The apparatus of claim 29 wherein said control module further measures subsystem power measurements at the output of each amplifier of said at least two signal transmission subsystems.

33. The apparatus of claim 29, wherein said phase-controlled digital oscillator is a direct digital synthesizer.

34. The apparatus of claim 33, wherein each of said signal transmission subsystems further comprises subsystem power meter for generating a subsystem power measurement based on a power measured at the output of said amplifier.

35. The apparatus of claim 34, wherein each of said signal transmission subsystems further comprises further comprises digital gain module for applying a gain to said upconverted signal based on a gain control signal, wherein said control module generates said gain control signal based on said combiner power measurement and said subsystem power measurement.

36. Apparatus for upconverting and amplifying a signal comprising:

combiner for combining a plurality of amplified signals to produce a combined amplified signal; and at least two signal transmission subsystems, wherein each signal transmission subsystem comprises:

phase-controlled digital oscillator for generating a phase-controlled digital signal, wherein the phase of said phase-controlled digital signal is based on a digital phase control signal;

digital-to-analog converter for receiving a phase-controlled digital signal and producing a phase-controlled analog mixing signal;

analog mixer for mixing an analog information signal with said phase-controlled analog mixing signal to produce an upconverted signal; and amplifier for amplifying said upconverted signal and producing one amplified signal of said plurality of amplified signals.

37. The apparatus of claim 36 further comprising combiner power meter for measuring the power of said combined amplified signal and producing a combiner power measurement.

38. The apparatus of claim 36, wherein each of said signal transmission subsystems further comprises a subsystem power meter for measuring the power of said one amplified signal and producing a subsystem power measurement.

39. The apparatus of claim 36, wherein said phase-controlled digital oscillator is a direct digital synthesizer.

40. The apparatus of claim 36 further comprising control module, for generating each of said digital phase control signals based on a combiner power measured at the output of said combiner and on subsystem power measurements measured at the output of each amplifier of said at least two signal transmission subsystems.

41. The apparatus of claim 36 further comprising control module for generating each of said digital phase control signals based on a combiner power measurement measured at the output of said combiner.

42. The apparatus of claim 41, wherein each of said signal transmission subsystems further comprises subsystem power meter for generating a subsystem power measurement based on a power measured at the output of said amplifier.

43. The apparatus of claim 42, wherein each of said signal transmission subsystems further comprises further comprises digital gain module for applying a gain to said upconverted signal based on a gain control signal, wherein said control module generates said gain control signal based on said combiner power measurement and said subsystem power measurement.

44. An apparatus comprising:

a first signal transmission subsystem, the first signal transmission subsystem comprising:

a first upconverter configured to upconvert a data signal to provide a first upconverted signal; and a first amplifier configured to amplify the first upconverted signal to provide a first amplified signal having a first amplified signal phase; and a second signal transmission subsystem, the second signal transmission subsystem comprising:

a phase-controlled digital oscillator configured to generate a phase-controlled digital mixing signal having a mixing signal phase based on a phase control signal;

a second upconverter configured to upconvert the data signal using the phase-controlled digital mixing signal to provide a second upconverted signal; and a second amplifier configured to amplify the second upconverted signal to provide a second amplified signal having a second amplified signal phase, wherein the phase control signal is adjusted based on a difference between the first amplified signal phase and the second amplified signal phase.

45. The apparatus of claim 44 wherein the phase-controlled digital oscillator is a direct digital synthesizer.

46. The apparatus of claim 44 further comprising:
a first linear digital filter configured to apply a first controlled group delay to the first upconverted signal; and
a second linear digital filter configured to apply a second controlled group delay to the second upconverted signal.

47. The transmitter of claim 44 further comprising a combiner configured to combine the first amplified signal and the second amplified signal to provide a combined amplified signal.

48. The apparatus of claim 47 wherein the combiner comprises a Wilkinson combiner.

49. The apparatus of claim 47 wherein the combiner comprises a Lange coupler.

50. The apparatus of claim 49 further comprising:
a first subsystem power meter configured to measure an amplitude of the first amplified signal; and
a second subsystem power meter configured to measure an amplitude of the second amplified signal.

51. The apparatus of claim 47 further comprising:
a combiner power meter configured to measure the amplitude of the combined amplified signal to provide a measured combiner power; and
a control module configured to generate the phase control signal based on the measured combiner power.

52. The apparatus of claim 44 further comprising:
a first digital gain module configured to apply a first digital gain to the first upconverted signal; and
a second digital gain module configured to apply a second digital gain to the second upconverted signal.

53. The apparatus of claim 52 wherein the second digital gain module performs spectrum shaping of the second upconverted signal.

54. The apparatus of claim 52 further comprising a control module configured to generate a gain control signal, wherein the second digital gain is based on the gain control signal.

55. The apparatus of claim 44 further comprising:
a linear digital filter configured to apply a controlled group delay to the second upconverted signal.

56. The apparatus of claim 55 further comprising a control module configured to generate a filter control signal, wherein the controlled group delay is based on the filter control signal.

* * * * *